United States Patent [19]

Dawson

[11] Patent Number: 4,463,320
[45] Date of Patent: Jul. 31, 1984

[54] AUTOMATIC GAIN CONTROL CIRCUIT
[75] Inventor: Sylvan L. Dawson, Marion, Iowa
[73] Assignee: Rockwell International Corporation, El Segundo, Calif.
[21] Appl. No.: 395,222
[22] Filed: Jul. 6, 1982
[51] Int. Cl.³ .............................................. H03G 3/30
[52] U.S. Cl. ..................................... 330/279; 330/284
[58] Field of Search ................. 330/138, 141, 86, 278, 330/279, 284

[56] References Cited

FOREIGN PATENT DOCUMENTS 2059202 4/1981 United Kingdom ................. 330/284

OTHER PUBLICATIONS

W. J. Hess "Audio Automatic Gain Control Amplifier with Nonvarying Time Constant" IBM Technical Disclosure Bulletin vol. 15, No. 1 Jun. 1972.

Primary Examiner—James B. Mullins
Assistant Examiner—G. Wan
Attorney, Agent, or Firm—Richard K. Robinson; George A. Montanye; H. Fredrick Hamann

[57] ABSTRACT

An automatic gain control circuit utilizes sampling techniques to vary the time constants of the automatic gain control circuits. The time constants are easily programmed by changing the sample rates instead of changing the RC time constants contained within the differentiator of the prior art circuits.

15 Claims, 4 Drawing Figures

AUTOMATIC GAIN CONTROL CIRCUIT

BACKGROUND OF THE INVENTION

This invention relates to automatic gain control circuits used in conjunction with gain control amplifiers and in particular to automatic gain control circuits having a variable and selectable range of coverage.

It is conventional practice to provide gain control amplifiers in radio receivers in order to effectively receive signals having diverse strengths as well as provide stability and minimize distortion. Maximum amplification may be provided for very weak signals, minimum amplification may be provided for strong signals, and controlled amplification may be provided for signals of intermediate strengths.

The usual automatic gain control circuit requires a filter or integrating capacitor to prevent undesired variation of automatic gain control voltage with modulation. A delay in the restoration of sensitivity of the receiver when the level of the incoming signal is suddenly decreased is caused by a charge retained on the capacitor. In U.S. Pat. No. 3,230,458 a circuit was disclosed that included a differentiator for detecting a sudden decrease of signal level and short circuit means responsive to the decrease exceeding a predetermined rate for momentarily short circuiting the filter capacitor. The controlled receiver is instantly restored to full sensitivity and the capacitor becomes charged quickly as required to control the signal for obtaining the desired output level.

The prior art automatic gain control circuits were limited in ranges of their time constants and the time constants were not easily changed or reprogrammed.

SUMMARY OF THE INVENTION

An automatic gain control circuit which utilizes sampling techniques to vary the time constants of the automatic gain control circuits is disclosed. The time constants are easily programmed by changing the sample rates in contrast to the prior art method of changing the RC time constants contained within the differentiator.

It is an object of the invention to provide an automatic gain control circuit that has a selectable time constant.

It is another object of the invention to provide an automatic gain control circuit that utilizes sample data techniques to generate an automatic gain control signal.

It is yet another object of the invention to provide an automatic gain control circuit in which the sampling period of a sampling circuit used to generate the automatic gain control signal is dependent upon the change of magnitude of the signal that is to be controlled.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
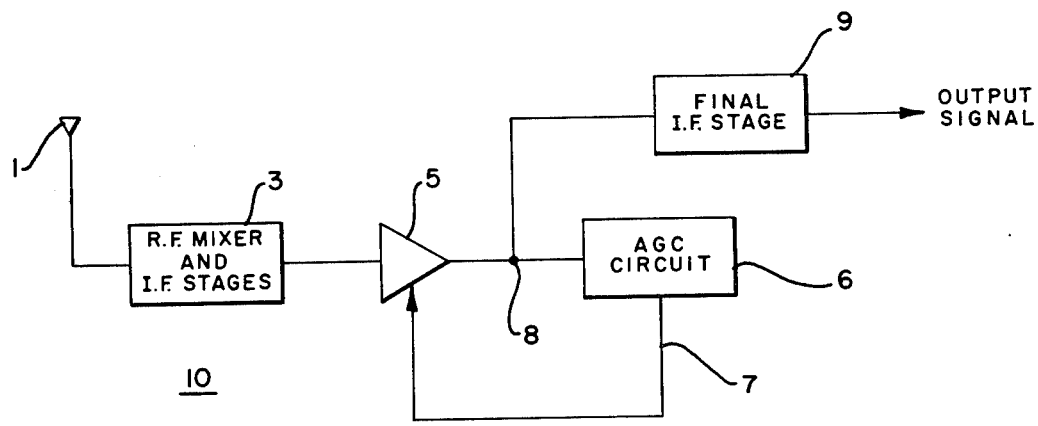
FIG. 1 is a block diagram of a radio receiver containing a gain control amplifier according to the invention.

In FIG. 1, a radio receiver 10 detects radio frequency signals via an antenna 1 and down converts the radio frequency signals to intermediate frequency signals by a mixer and IF stages 3 for amplification by a variable gain amplifier 5. The gain of the variable gain amplifier 5 is controlled by an Automatic Gain Control (AGC) circuit 6 that causes the gain of the variable gain amplifier 5 to decrease at a more rapid rate if the signal level present on the output terminal 8 of the variable gain amplifier 5 exceeds a first selected threshold ("attack") or causes the gain of the variable gain amplifier 5 to increase at a more rapid rate if the output signal level on output terminal 8 is lower than a second selected threshold ("decay") so as to insure that the signal level on the output terminal 8 is always maintained at an established level. The AGC circuit 6 controls the variable gain amplifier 5 by the magnitude of the voltage that is present on conductor 7. The gain controlled signal is applied to a final IF stage 9 where it is down converted into an output signal which is usually an audio signal.

Figure 2:
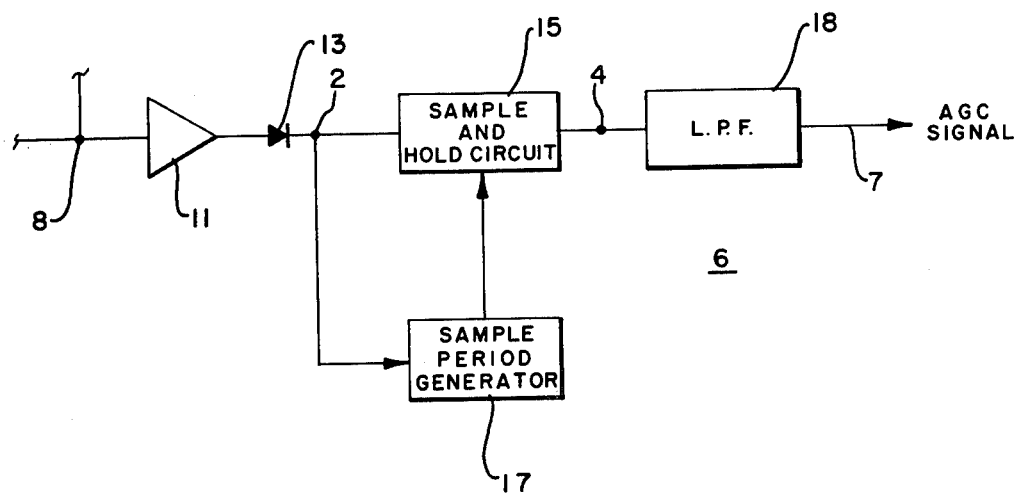
FIG. 2 is a block diagram of an automatic gain control circuit according to the invention.

The automatic gain control circuit 6 as illustrated in FIG. 2 has an input buffer amplifier 11 the output of which is applied to a detector circuit 13 (represented by a diode in the drawing). The output of the detector circuit 13 which is referred to as a detected signal is applied to a sample and hold circuit 15 for sampling and simultaneously to a sample period generator 17. The magnitude of the detected signal will cause the sample period generator 17 to either increase the sampling rate of the sample and hold circuit 15 or to decrease the sampling rate of the sample and hold circuit 15. The output of the sample and hold circuit 15 is passed to a low pass filter 18 where the sampled signal is filtered and an AGC signal is provided on conductor 7 for controlling the variable gain amplifier 5. The AGC signal, although often referred to as a DC signal, is really a signal of one polarity whose amplitude may be varied as required to control the gain of the variable gain amplifier 5. The rate of amplitude variation of the output 7 of the automatic gain control circuit 6 is dependent upon the sample period generator 17 which controls the sampling rate of the sample and hold circuit 15 as well as the on period and the off period of the sampling switch.

Figure 3:
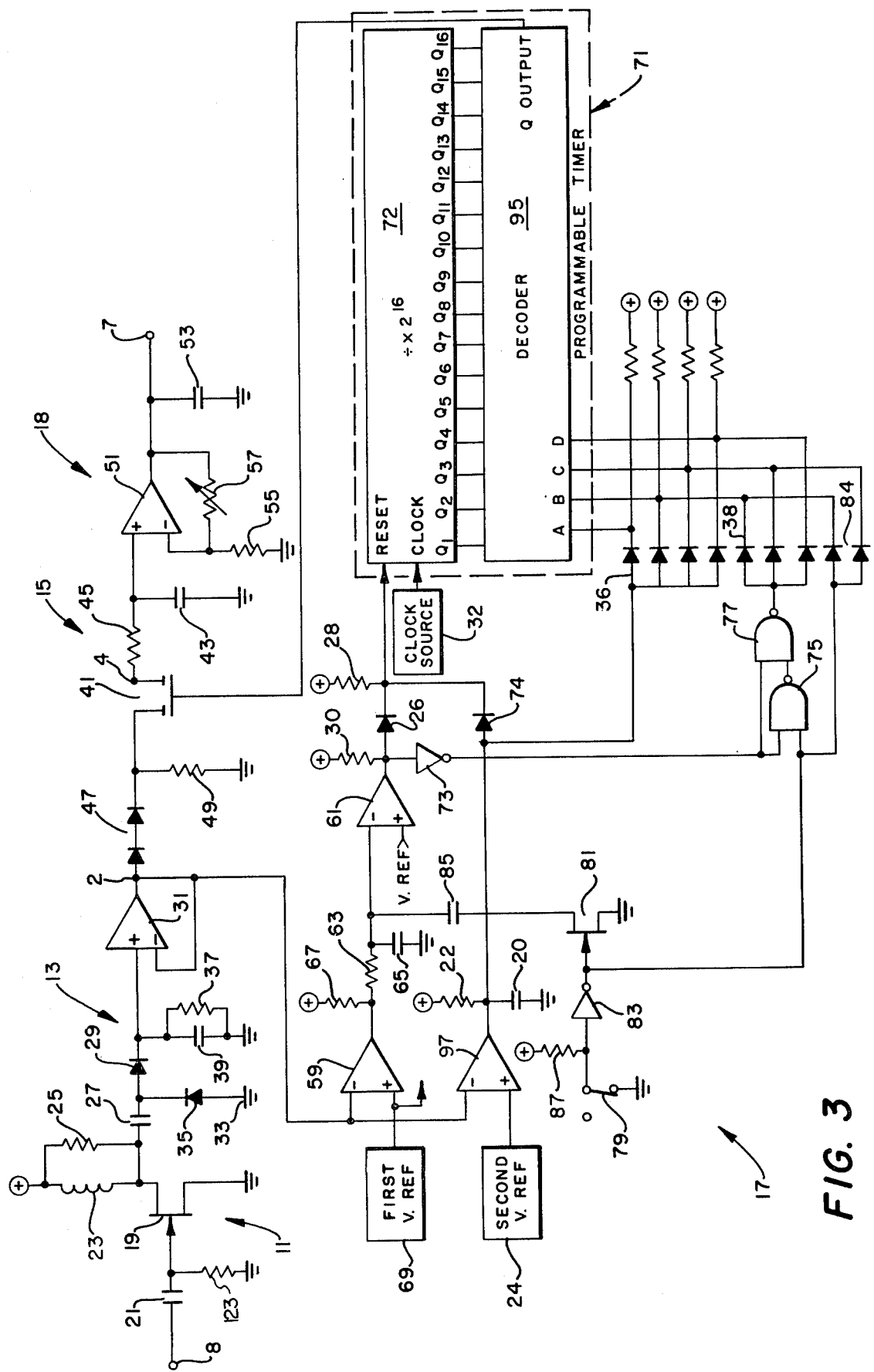
FIG. 3 is a schematic diagram of the automatic gain control circuit of FIG. 2.

In FIG. 3 to which reference should now be made, the buffer amplifier 11 of FIG. 2 is a field effect transistor (FET) 19 to which the detected signal is coupled to the gate via the coupling capacitor 21 and is applied across the resistor 123. The gain of the field effect transistor 19 is determined by a bias voltage from a positive voltage source, a choke 23 and a resistor 25. The output of the buffer amplifier 11 is coupled to the detector circuit 13 via the coupling capacitor 27.

The detector circuit 13 includes a detector diode 29 for passing the positive portion of the amplified detected signal to a voltage follower circuit 31. The negative portion of the amplified detected signal is conducted to the referenced potential or ground 33 by the diode 35. The output of the detector 29 is filtered by the RC filter that includes a resistor 37 and a capacitor 39. The sample and hold circuit 15 includes a FET switch 41 and a capacitor 43. A resistor 45 is a current limiting resistor and limits the rate of charge of the capacitor 43. The output of the voltage follower 31 is coupled to the sample and hold circuit 15 by a voltage divider circuit that includes the diode pair 47 and the resistor 49.

The low pass filter 18 includes an operational amplifier 51, a holding capacitor 53 and a gain control circuit that includes a resistor 55 and a variable resistor 57.

The output of the voltage follower 31 is also applied to a first threshold circuit that includes the two operational amplifiers 59 and 61. The output of the operational amplifier 59 is integrated by the integrator that includes a resistor 63 and a capacitor 65. The positive bias is applied to the output of the operational amplifier 59 by a resistor 67 that is connected to a positive voltage source. When the output of the voltage follower 31 is less than the first voltage reference as provided by a first voltage reference 69, there is a positive signal applied to the integrator from the output of the operational amplifier 59. This positive signal causes the charge on the capacitor 65 to change to a positive charge which is sensed by an operational amplifier 61 and forces its output signal level towards the negative direction removing the reset from a programmed timer 71. Additionally, the output of the operational amplifier 61 is inverted by an inverting amplifier 73 and applied to NAND gates 75 and 77 which, as will be discussed later, are used to decode the sampling period of the sample and hold circuit 15. The programmable timer 72 provides pulses to the sample and hold circuit at the decoded rate until the voltage level at node 2 exceeds the first voltage reference.

The sampling period of the sample and hold circuit 15 may also, in the preferred embodiment, be varied by the positioning of switch 79. When switch 79 is in the closed position, then a field effect transistor 81 is forward biased by an inverting amplifier 83 inverting the logic zero signal on its input terminal, and connecting one side of capacitor 85 to ground. Capacitor 85 is then in parallel with capacitor 65 and the charge time required for the parallel combination of the capacitors 65 and 85 is increased slowing the amount of time that it takes the signal on the negative terminal of the operational amplifier 61 to overcome the first reference signal that is on the positive terminal. When switch 79 is in the open position, the positive voltage source is applied through resistor 87 to the inverting amplifier shutting off the field effect transistor 81 and leaving just the capacitor 85 in the integrating circuit that includes resistor 63. Additionally, the output of the inverting amplifier 83 is applied to the diode pair 84 and is used by the programmed timer 71 to decode the selected output.

A second threshold selector includes an operational amplifier 97 and an integrator that is made up of a capacitor 20 and a resistor 22 that is connected to a positive voltage source (not shown). The operational amplifier 97 compares the detected signal level that is applied to its negative terminal with a second voltage reference 24. When the signal on the negative terminal is greater than the signal on the positive terminal, the output of the operational amplifier 97 is negative and discharges capacitor 20 of the positive signal that is stored there through the current flow through the biasing resistor 22. This action removes the reset from the programmable timer 71. The decoder 95 decodes the count from the counter 72 of the programmable timer 71 and applies the decoded signal to the switch 41. Diodes 26 and 74 act as an OR gate by applying the output of either the operational amplifier 61 or 97 to the reset terminal of the programmable timer 71. The reset terminal is biased off by the biasing resistor 28 and diode 26 is biased off by the current flow through the resistor 30 which is connected to a positive voltage source (not shown). The programmable timer will be reset when the voltage level at node point 2 is less than the second voltage reference 24.

The programmable timer 71 includes the divider 72 and the decoder 95. The divider 72 is driven by a clock source 32 which sequentially provides output pulses on the outputs Q1 through QN. In the embodiment shown, N is 16. The decoder 95, based upon the selection of the A, B, C or D terminals, will select 1 of the 16 outputs from the divider 71 to place on its output terminal for connecting to the switch 41. The output of the operational amplifier 97, in the preferred embodiment, selects terminal 16 through the diodes 36; whereas the output of AND gate 77 selects terminal 15 through the diodes 38. Diode pair 84 as well as the output of the NAND gate 83 selects terminal 6. This facilitates the varying of the sampling period of the sample and hold circuit 15. Of course, the sampling period may be further varied by changing the frequency of the clock source, the number of bits in the divider 72 and decoder 95 and the number of diodes in the diode sets 36, 38 and 84.

Figure 4:
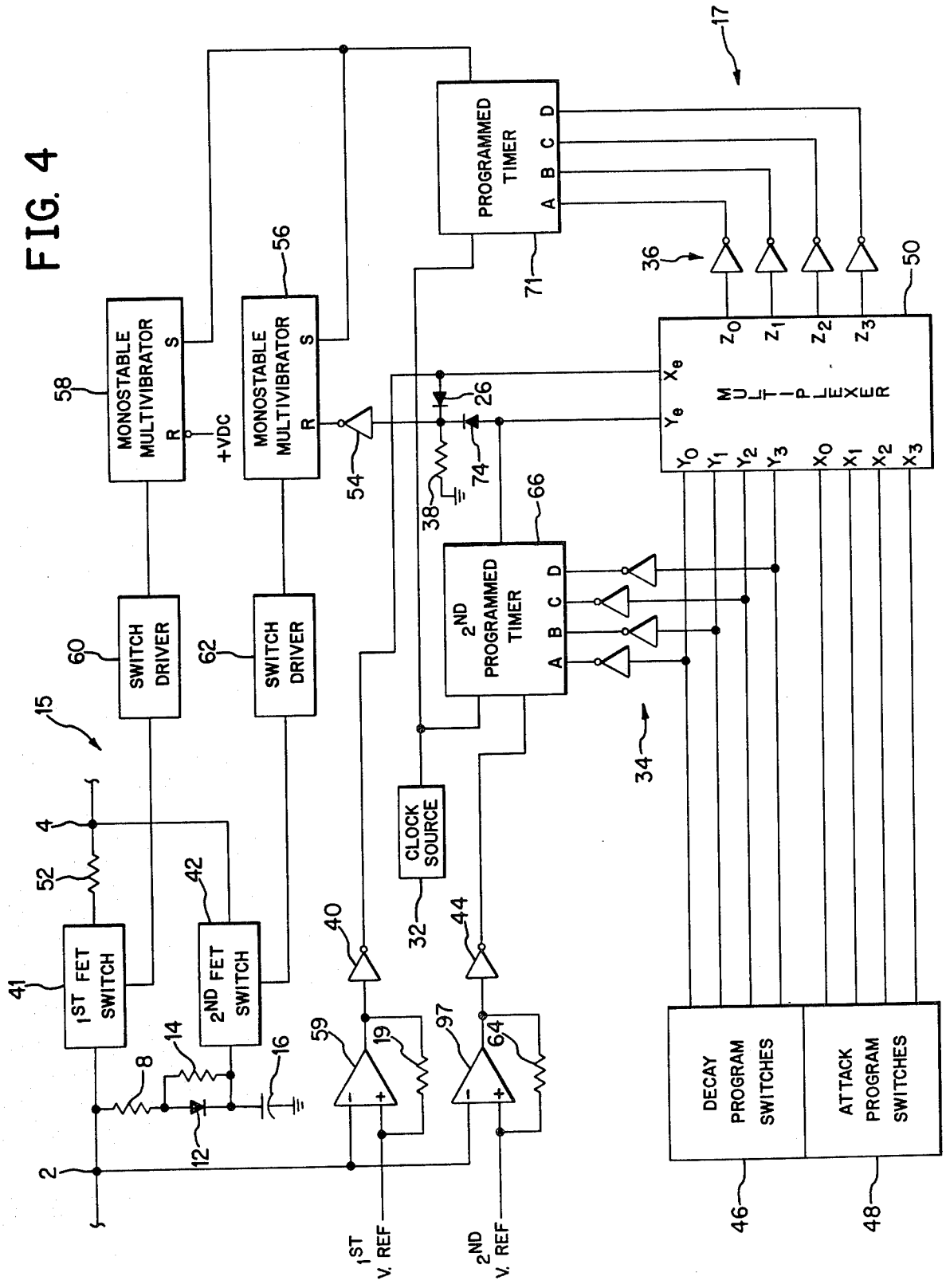
FIG. 4 is a schematic diagram of an alternate embodiment of the automatic gain control circuit of FIG. 2.

FIG. 4, to which reference should now be made, is a digital implementation of the sample and hold circuit 15 and the sample generator 17. The input signal is picked up at node 2 and sensed by the operational amplifiers 59 and 97. The operational amplifier 59 compares the sensed signal at node point 2 with the first voltage reference and, based upon this comparison and the gain that is established by feedback resistor 19, applies the difference to an inverter 40, the output of which is applied to a multiplexer 50 and a diode "OR" gate that includes diodes 74 and 26 as well as resistor 38 and inverter 54. The operational amplifier 97 compares the signal at node 2 with the second voltage reference and amplifies the difference in the gain that is established by the feedback resistor 64 and applies this amplified difference by way of the invertor 44 which converts the amplified difference to logic levels for application to a second programmed timer 66. It should be noted that the inverter 40 also performs a similar function as does the inverter 44 of converting the output of the operational amplifier 59 into logic level signals. The second programmed timer 66 as well as the programmed timer 71 each include a divider 72 and a decoder 95 as is shown on FIG. 3. The selected output terminal from the divider 66 is selected by the decay program switches 46 which is a plurality of switches 79 and bias resistors 87. The second programmed timer 66 is driven by a clock source 32. Based upon the decoded output and reset condition, the programmed timer 66 provides every selected period a positive going pulse to a monostable multivibrator 56 via diode 74 and inverter 54. The decay program switches facilitate the modification of the hang time of an automatic gain control signal. Hang time is defined as a period of time between the occurrence of a downward change in the voltage level at node 2 and the time that change is reflected in the automatic gain control signal present on conductor 7. The attack program switches are similar switches to those described in conjunction with the decay program switches and also illustrated on FIG. 3 by a switch 79 and a bias resistor 87 and they determine the attack time of the automatic gain control signal. The attack time is defined as the period of time in which there is an upward change in the signal level at node 2 that is reflected by the automatic gain control signal present on conductor 7. The multiplexer 50 multiplexes either the decay program switches or the attack program switches to the programmed timer 71 so as to select the appropriate sampling rate of the sample and hold circuit 15. The multiplexer 50 provides a signal on a Z terminal in accordance with the following:

Logic equation: $Z_N = X_E X_n + Y_E Y_N$ where N is equal to 0, 1, 2 or 3 and reflects the input terminal numbers and E represents the enable signals.

It is obvious from the above equation that the multiplexer 50 is a four stage AND R device. The output of the multiplexer 50 is coupled to the programmed timer 71 by the inverters 36. The programmed timer 71 will provide a positive going signal on its output terminal based upon the period of the clock that is provided by the clock source 32 and the decoded output of the divider 72 that is determined by the decay program switches 46 and the attack program switches 48 that the logic levels on $X_E$ and $Y_E$ will provide positive going pulses to the monostable multivibrators 56 and 58. The monostable multivibrators 56 and 58 will provide an output signal to the switch drivers 60 and 62 which in turn will control the on time of the first FET switch 41 and the second FET switch 42. The second FET switch 42 removes transients from the signals at node 4 by first integrating and filtering the signal at node point 2 by the resistors divider network of resistor 8 and 14 and the diode 12 and capacitor 16. This filters the signal when both the first FET switch and the second FET switch are combined with the signal that is conducted through the first FET switch from node 2 to node 4 via resistor 52 to remove glitches and spikes from the signal. The output of the second programmed timer can reset the second FET switch 42 by resetting the monostable multivibrator 56. It is obvious from the above discussion that by the setting of the decay program 46 and the attack program switches 48 that the switching period of the first FET switch 41 and the second FET switch 42 may be readily varied. The channel on the multiplexer 50 is selected to insure that the proper decay time is programmed through the programmed timer 71 by the output of the second programmed timer 66 and the attack program switches are applied to the programmed timer 71 whenever the operational amplifier 59 senses at node point 2 a signal level that is greater than the first voltage reference. This in turn will cause the attack program switches to be enabled as well as cause the monostable multivibrator to be reset as long as the first voltage reference is less than the voltage level at node 2.

Many changes and modifications in the above described invention can, of course, be carried out without departing from the scope thereof. Accordingly, the invention is intended to be limited only by the scope of the appended claims.

I claim:

1. In a radio receiver, an amplifier stage comprising:
a variable gain amplification means having an input and an output;
automatic gain control means operatively connected to the output and producing a gain control signal as a function of a first signal at the output and providing the gain control signal to the variable gain amplification means; and
the automatic gain control means includes a detector means for converting the first signal into a detected signal, a sampling circuit means for sampling of the detected signal at a variable sampling rate, low pass filter means for filtering the sample signal to obtain thereby the gain control signal, and sample period generator means for generating the sample period for the sampling circuit means from the detected signal.

2. In a radio receiver, the amplifier stage as defined in claim 1 wherein said sample period generator means comprises:
clock source means for providing a stream of clock pulses;
divider means for dividing the stream of clock pulses by a preselected number of 1 through N where N is a positive integer; and
pulse rate selector means responsive to the detected signal for selecting the selectable number N.

3. In a radio receiver, the amplifier stage as defined by claim 2 wherein the pulse rate selector means comprises:
a first AGC hang time selector means for comparing the detected signal and, when the detected signal exceeds a first established threshold for sampling the detected signal at a first selected period that is represented by a number of the selected numbers of 1 through N; and
second AGC hang time selector means for selecting a second period of sampling when the detected signal exceeds a second preselected threshold.

4. In a radio receiver, the amplifier stage as defined by claim 2 or 3 further comprising:
switch means for changing a time constant required for the detected signal to reach the first selected threshold.

5. An amplifier comprising:
a variable gain amplification means having an input and an output;
automatic gain control means operatively connected to the output and producing a gain control signal as a function of a first signal at the output and providing the gain control signal to the variable gain amplifier means; and
the automatic gain control means includes a detector means for converting the first signal into a detected signal, a sampling circuit means for sampling of the detected signal at a variable sampling rate, low pass filter means for filtering the sample signal to obtain thereby the gain control signal, and sample period generator means for generating the sample period for the sampling circuit means from the detected signal.

6. The amplifier stage as defined by claim 5 wherein said sample period generator means comprises:
clock source means for providing a stream of clock pulses;
divider means for dividing the stream of clock pulses by a preselected number of 1 through N where N is a positive integer; and
pulse selector means responsive to the detected signal for selecting the selectable number N.

7. The amplifier as defined by claim 6 wherein the pulse selector means comprises:
a first threshold selector for comparing the detected signal and when the detected signal exceeds a first established threshold, for sampling the detected signal at a first selected period that is represented by a number of the selected numbers of 1 through N; and second threshold selector means for selecting a second period of sampling when the detected signal exceeds a second preselected threshold.

8. The amplifier as defined by claim 6 or 7 further comprising:
switch means for changing a time constant required for the detected signal to reach the first selected threshold.

9. A method of amplifying a signal comprising:
varying the gain of an amplifier having an input and an output with a gain control signal;
producing the gain control signal as a function of a first signal at the output;
providing the gain control signal to the amplifier; and
producing the gain control signal by; converting the first signal into a detected signal, sampling of the detected signal at a variable sampling rate, filtering the sample signal to obtain thereby the gain control signal, and generating the sample period for the sampling circuit means from the detected signal.

10. The method according to claim 9 wherein said step of generating the sample period comprises:
providing a stream of clock pulses;
dividing the stream of clock pulses by a preselected number of 1 through N where N is a positive integer; and
selecting the selectable number N.

11. The method according to claim 10 wherein the step of selecting the selectable number N comprises: comparing the detected signal and, when the detected signal exceeds a first established threshold, sampling the detected signal at a first selected period that is represented by a number of the selected numbers of 1 through N; and
selecting a second period of sampling when the detected signal exceeds a second preselected threshold.

12. In an automatic gain control system including a variable gain amplifier having an input and an output and an automatic gain control circuit coupled to said output for providing a gain control signal for varying the gain of the variable gain amplifier, the improvement in the automatic gain control circuit comprising:
means coupled to said output for sampling said output at a variable sampling rate and providing a sampled output as said gain control signal; and
means responsive to said output for controlling the sampling rate of said means for sampling.

13. The system of claim 12 further including means coupled to said output for providing a detected signal and further wherein said means for sampling is coupled to receive said detected signal for sampling said detected signal at said variable sampling rate.

14. The system of claim 13 further including means for lowpass filtering said sampled output to provide said gain control signal.

15. The system of claim 12 wherein said means for controlling the sampling rate includes means for comparing said detected signal with at least one threshold signal for controlling said sampling rate.

* * * * *